(12) United States Patent
Seol

(10) Patent No.: US 11,349,180 B2
(45) Date of Patent: May 31, 2022

(54) BATTERY PACK

(71) Applicant: SAMSUNG SDI CO., LTD., Yongin-si (KR)

(72) Inventor: Jihwan Seol, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 71 days.

(21) Appl. No.: 16/561,087

(22) Filed: Sep. 5, 2019

(65) Prior Publication Data

US 2020/0083511 A1    Mar. 12, 2020

(30) Foreign Application Priority Data

Sep. 11, 2018  (KR) .................. 10-2018-0108517

(51) Int. Cl.
| | |
|---|---|
| *H01M 10/48* | (2006.01) |
| *H01M 10/42* | (2006.01) |
| *H01M 10/0525* | (2010.01) |
| *H01M 50/502* | (2021.01) |
| *H01M 50/213* | (2021.01) |
| *H01M 50/531* | (2021.01) |
| *H01M 50/20* | (2021.01) |
| *H05K 1/18* | (2006.01) |

(52) U.S. Cl.
CPC ..... *H01M 50/502* (2021.01); *H01M 10/0525* (2013.01); *H01M 10/425* (2013.01); *H01M 10/4207* (2013.01); *H01M 10/482* (2013.01); *H01M 10/486* (2013.01); *H01M 50/20* (2021.01); *H01M 50/213* (2021.01); *H01M 50/531* (2021.01); *H05K 1/18* (2013.01); *H01M 2010/4271* (2013.01)

(58) Field of Classification Search
None
See application file for complete search history.

(56) References Cited

U.S. PATENT DOCUMENTS

| | | | |
|---|---|---|---|
| 2002/0022178 A1 * | 2/2002 | Asaka | H01M 10/4257 429/158 |
| 2012/0148877 A1 | 6/2012 | Kalman | |
| 2013/0078485 A1 | 3/2013 | Muis | |

(Continued)

FOREIGN PATENT DOCUMENTS

| | | |
|---|---|---|
| CN | 106169546 A * | 11/2016 |
| JP | 2018-041618 A | 3/2018 |

(Continued)

OTHER PUBLICATIONS

English machine translation of CN106169546A from Espacenet originally published to Zhou Nov. 2016 (Year: 2016).*

(Continued)

*Primary Examiner* — Ula C Ruddock
*Assistant Examiner* — Mary Grace Byram
(74) *Attorney, Agent, or Firm* — Lee IP Law, P.C.

(57) ABSTRACT

A battery pack including a plurality of battery cells; and a rigid printed circuit board (PCB) electrically connected to each battery cell and extending across the plurality of battery cells, wherein the rigid PCB includes a bus to electrically connect the plurality of battery cells to each other, and a battery management system (BMS) to control a charge/discharge operation of the plurality of battery cells.

11 Claims, 15 Drawing Sheets

(56) References Cited

U.S. PATENT DOCUMENTS

| | | | |
|---|---|---|---|
| 2014/0212695 A1* | 7/2014 | Lane | H01M 10/425 |
| | | | 429/7 |
| 2014/0255750 A1* | 9/2014 | Jan | H01M 50/502 |
| | | | 429/120 |
| 2018/0069275 A1 | 3/2018 | Ito et al. | |
| 2018/0086472 A1* | 3/2018 | Gore | H01M 50/502 |
| 2018/0331334 A1* | 11/2018 | Lee | H01M 50/502 |
| 2019/0280267 A1* | 9/2019 | Bae | H01M 10/6556 |

FOREIGN PATENT DOCUMENTS

| | | | | |
|---|---|---|---|---|
| KR | 10-2017-0122874 A | 11/2017 | | |
| WO | WO 2009-011748 A1 | 1/2009 | | |
| WO | WO-2015016566 A1 * | 2/2015 | ........ | H01M 10/6557 |
| WO | WO 2018/105905 A | 6/2018 | | |
| WO | WO-2018105905 A1 * | 6/2018 | .......... | H01M 10/613 |

OTHER PUBLICATIONS

Extended European Search Report issued by the European Patent Office dated Dec. 12, 2019 in the examination of corresponding European Patent Application No. 19196830.4.

\* cited by examiner

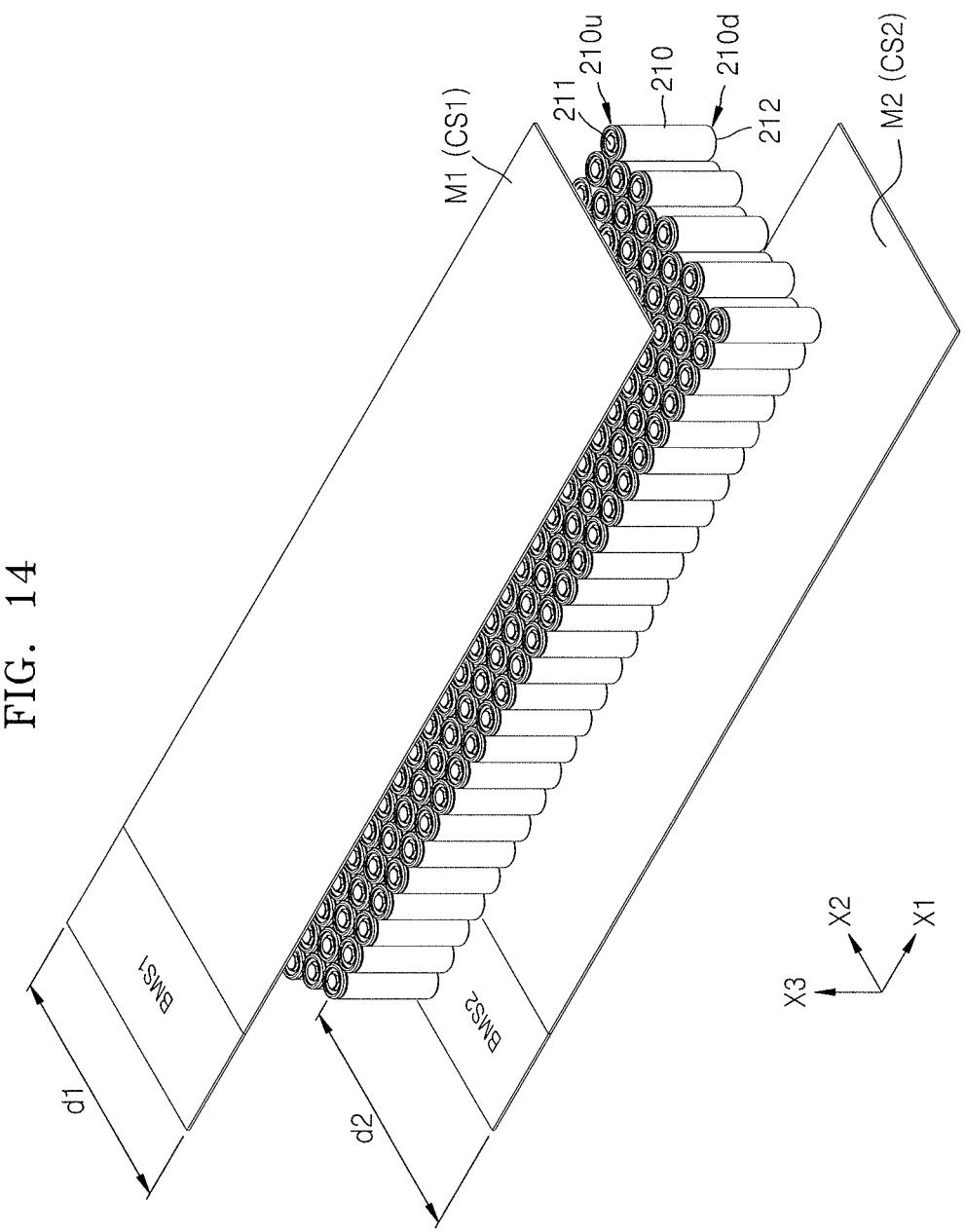

BATTERY PACK

CROSS-REFERENCE TO RELATED APPLICATION

Korean Patent Application No. 10-2018-0108517, filed on Sep. 11, 2018, in the Korean Intellectual Property Office, and entitled: "Battery Pack," is incorporated by reference herein in its entirety.

BACKGROUND

1. Field

One or more embodiments relate to battery packs.

2. Description of the Related Art

Secondary batteries are rechargeable, unlike primary batteries. Secondary batteries may be used as energy sources for mobile devices, electric vehicles, hybrid vehicles, electric bicycles, uninterruptible power supplies, or the like, and depending on the types of external devices to which they are applied, the secondary batteries may be used in the form of a single battery or in the form of a battery module or pack in which a plurality of batteries are connected and combined into one unit.

A small mobile device such as a mobile phone may operate for a certain time according to the output and capacity of a single battery. In the case of long-time driving or high-power driving such as in an electric vehicle or a hybrid vehicle with high power consumption, a battery module including a plurality of batteries may be preferred due to output and capacity issues, and the battery module may increase the output voltage or the output current according to the number of built-in batteries.

SUMMARY

The embodiments may be realized by providing a battery pack including a plurality of battery cells; and a rigid printed circuit board (PCB) electrically connected to each battery cell and extending across the plurality of battery cells, wherein the rigid PCB includes a bus to electrically connect the plurality of battery cells to each other, and a battery management system (BMS) to control a charge/discharge operation of the plurality of battery cells.

The rigid PCB may have a rectangular shape including a pair of long sides and a pair of short sides, and the bus may be adjacent to one short side and the BMS is adjacent to the other short side.

The rigid PCB may include a plurality of coupling holes along the pair of long sides thereof, the coupling holes being to connect first and second connectors.

The bus and the BMS may have a common, continuous base layer.

The common base layer may include an insulating substrate.

The common base layer may include a metal substrate.

The rigid PCB may include a first surface and a second surface, the first surface being opposite to the second surface, and the bus may include a first conductive region on the first surface of the rigid PCB and a second conductive region on the second surface of the rigid PCB.

Each battery cell may include a first electrode and a second electrode, the first and second electrodes of each battery cell may be at a same one end of the battery cell in a lengthwise direction of the battery cell, and the rigid PCB may extend across the one end of the battery cells.

The rigid PCB may include a plurality of openings therein, the openings exposing the first and second electrodes of each battery cell, the first electrode of each battery cell may be connected to the rigid PCB through a first electrode tab in the opening, and the second electrode of each battery cell may be connected to the rigid PCB through a second electrode tab in the opening.

The rigid PCB may include a first rigid PCB extending across one end of each battery cell and a second rigid PCB extending across another end of each battery cell, and the bus may include a first conductive region on the first rigid PCB and a second conductive region on the second rigid PCB.

The first rigid PCB may include a first metal substrate; the second rigid PCB may include a second metal substrate, the first metal substrate and the second metal substrate may be unpatterned and plate-shaped, the first metal substrate may provide the first conductive region, and the second metal substrate may provide the second conductive region.

The first rigid PCB may include an inner insulating layer on an inner surface of the first metal substrate and an outer insulating layer on an outer surface of the first metal substrate, and the second rigid PCB may include an inner insulating layer on an inner surface of the second metal substrate and an outer insulating layer on an outer surface of the second metal substrate.

The inner insulating layers and the outer insulating layers of the first rigid PCB and the second rigid PCB may each include an electrode hole at a position corresponding to an electrode of each battery cell.

The BMS may include a first BMS on the first rigid PCB and a second BMS on the second rigid PCB.

The battery pack may further include a connector electrically connecting the first BMS to the second BMS.

The bus may include a measurement pattern to transmit state information of the battery cell to the BMS, and the measurement pattern may be on a first surface of the rigid PCB or a second surface of the rigid PCB.

The bus may include a conductive region connected to an electrode of each battery cell, and the measurement pattern may be formed together on a surface of the rigid PCB where the conductive region is formed.

The bus may include a sensor hole into which a thermistor to measure a temperature of the battery cell is insertable.

The embodiments may be realized by providing a battery pack in which a plurality of battery cells are accommodatable, the battery pack including a rigid printed circuit board (PCB), wherein the rigid PCB is electrically connectable to the plurality of battery cells in a state in which the rigid PCB extends across the plurality of battery cells, and the rigid PCB includes a bus to electrically connect the plurality of battery cells to each other, and a battery management system (BMS) to control a charge/discharge operation of the plurality of battery cells.

BRIEF DESCRIPTION OF THE DRAWINGS

Features will be apparent to those of skill in the art by describing in detail exemplary embodiments with reference to the attached drawings in which:

FIG. 14 illustrates a perspective view of a portion of the rigid PCB of FIG. 11.

DETAILED DESCRIPTION

Figure 1:
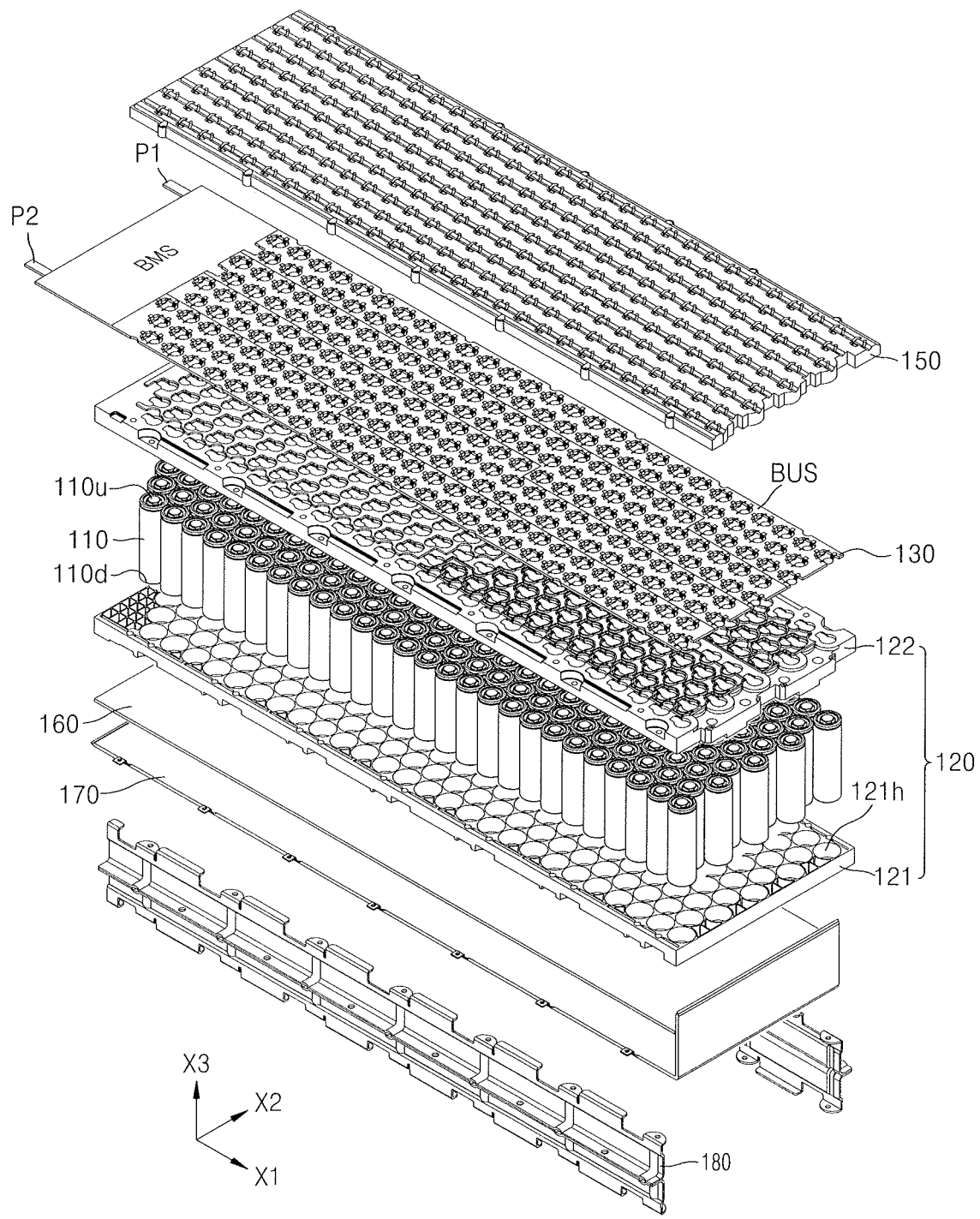
FIG. 1 illustrates an exploded perspective view of a battery pack according to an embodiment of the present disclosure.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" and "or" includes any and all combinations of one or more of the associated listed items. Expressions such as "at least one of," when preceding a list of elements, modify the entire list of elements and do not modify the individual elements of the list.

Hereinafter, battery packs according to example embodiments of the present disclosure will be described with reference to the accompanying drawings.

Figure 2:
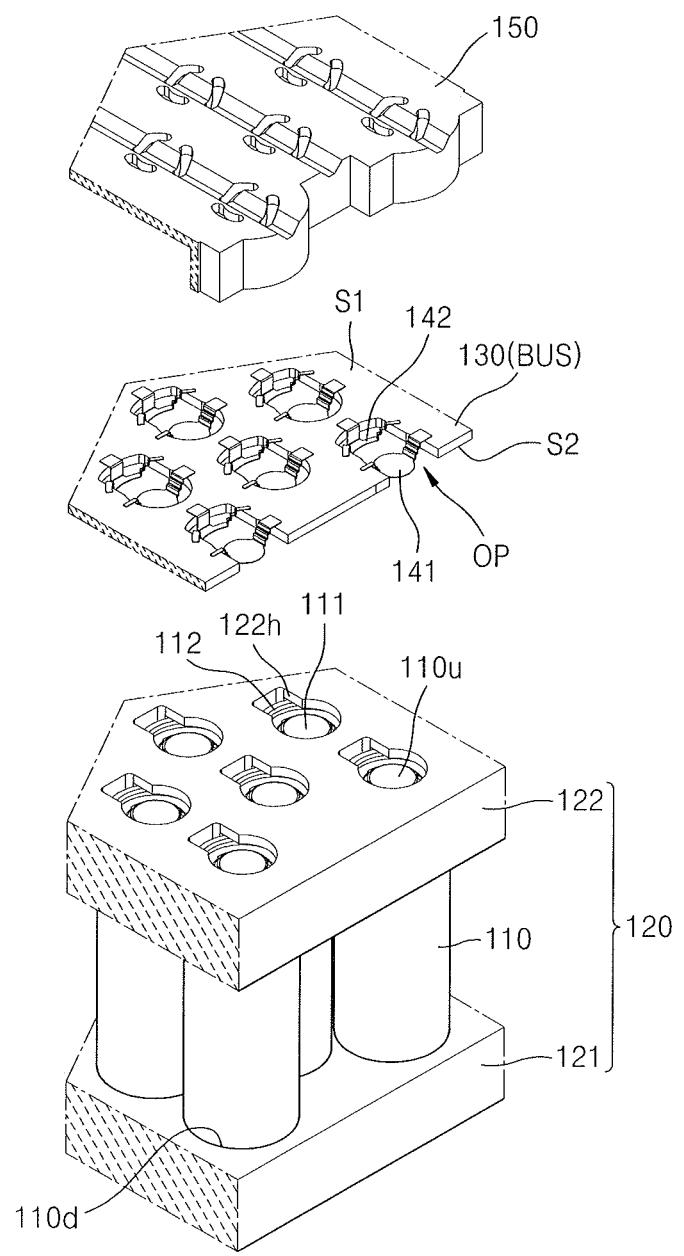
FIG. 2 illustrates an enlarged exploded perspective view of a portion of the battery pack of FIG. 1.
Figure 3:
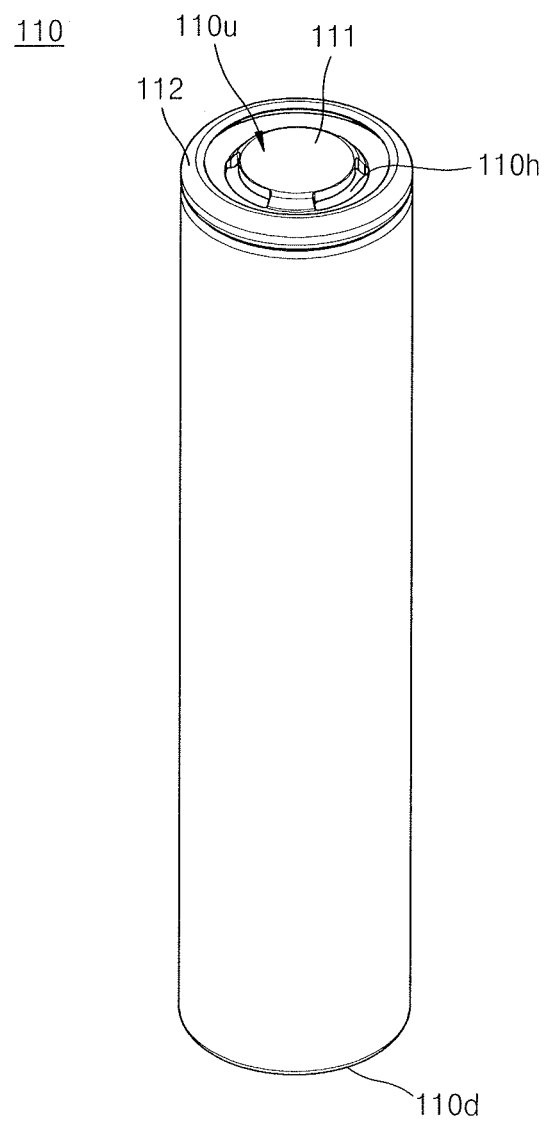
FIG. 3 illustrates a perspective view of a battery cell of FIG. 1.

FIG. 1 illustrates an exploded perspective view of a battery pack according to an embodiment of the present disclosure. FIG. 2 illustrates an enlarged exploded perspective view of a portion of the battery pack of FIG. 1. FIG. 3 illustrates a perspective view of a battery cell of FIG. 1.

A battery pack of the present disclosure may include or accommodate a plurality of battery cells 110 and may include a rigid printed circuit board (PCB) 130 that is electrically connectable to each of the battery cells 110 while extending across the plurality of battery cells 110. For example, the plurality of battery cells 110 may be removable and/or replaceable in the battery pack (e.g., the battery pack may not include any battery cells 110 therein). The rigid PCB may control a charge/discharge operation of the battery cells 110.

The plurality of battery cells 110 and may include a plurality of cylindrical battery cells 110. For example, the battery cell 110 may have an upper end 110$u$ and a lower end 110$d$ along a lengthwise direction (e.g., corresponding to a vertical direction or third direction X3 in FIG. 1) and may include a circumferential surface between the upper end 110$u$ and the lower end 110$d$. In an implementation, battery cells 110 of various shapes such as elliptical or polygonal shapes may be applied.

The battery cells 110 may be arranged to have lengthwise directions (third directions X3) parallel to each other. The battery cells 110 may be arranged, e.g., in a column direction and a transverse direction (e.g., first direction X1 and second direction X2 in FIG. 1), or may be arranged in a zigzag pattern such that another battery cell 110 is arranged in a valley region of adjacent battery cells 110 in order to reduce a dead space due to a valley region between the cylindrical battery cells 110.

The rigid PCB 130 may be electrically connected to the battery cell 110 while extending across at least one of the upper end 110$u$ and the lower end 110$d$ of the battery cell 110. In an implementation, as illustrated in FIG. 2, a first electrode 111 and a second electrode 112 of the battery cell 110 may both be at the upper end 110$u$ of the battery cell 110 (e.g., at the same end of the battery cell 110), and the rigid PCB 130 may be electrically connected to the first and second electrodes 111 and 112 of the battery cell 110 while extending across the upper end 110$u$ of the battery cell 110.

The battery cells 110 may be supported by a cell holder 120 and may be arranged at the respective correct positions by the cell holder 120. For example, the cell holder 120 may include sidewalls surrounding the upper end 110$u$ and the lower end 110$d$ of the battery cell 110 to define the correct position of each battery cell 110; each battery cell 110 may be assembled or accommodated at the correct position defined by the sidewalls of the cell holder 120; and the plurality of battery cells 110 may be structurally bound to or fixed relative to each other through the cell holder 120. The cell holder 120 may include a first holder 121 and a second holder 122 arranged on opposite ends of, e.g., beneath and on top of, the battery cells 110. For example, the first holder 121 may be arranged to cover or accommodate the lower end 110$d$ of the battery cell 110, and the second holder 122 may be arranged to cover or accommodate the upper end 110$u$ of the battery cell 110.

In an implementation, a plurality of openings 122$h$ (see FIG. 2) may be in the second holder 122, and the upper ends 110$u$ of the battery cells 110 may be exposed through the respective openings 122$h$. Both the first and second electrodes 111 and 112 (having opposite polarities) may be at the upper end 110$u$ of the battery cell 110, and the opening 122$h$ corresponding to each battery cell 110 may be in the second holder 122 to be aligned with the upper end 110$u$ of the battery cell 110. For example, both the first and second electrodes 111 and 112 at the upper end 110$u$ of the battery cell 110 may be exposed through the opening 122$h$ of the second holder 122, and the first and second electrodes 111 and 112 of the battery cell 110 may be connected to a charge/discharge current path through the rigid PCB 130 on the second holder 122.

In an implementation, the electrical connections of the first and second electrodes 111 and 112 with different polarities may all be made through or at the upper end 110$u$ of the battery cell 110, and a separate opening 121$h$ (see FIG. 1) may not need to be formed in the first holder 121 on the side of the lower end 110d of the battery cell 110. In an implementation, for the purpose of heat dissipation, not electrical connection, a separate opening 121h may be provided in the first holder 121, and the lower end 110d of the battery cell 110 may be exposed through the separate opening 121h.

In an implementation, the electrical connection may be made at the upper end 110u in the lengthwise direction (third direction X3) of the battery cell 110, and the heat dissipation may be made at the lower end 110d. For example, the rigid PCB 130 (for forming an electrical connection with the battery cell 110) may be arranged on the upper end 110u of the battery cell 110, e.g., on the second holder 122. In an implementation, a cooler 160 (see FIG. 1) may be on the lower end 110d of the battery cell 110, e.g., beneath the first holder 121. The cooler 160 may be thermally coupled adjacent to the lower end 110d of the battery cell 110 and, e.g., the opening 121h capable of exposing at least a portion of the lower end 110d of the battery cell 110 may be in the first holder 121 and a sidewall surrounding the lower end 110d of the battery cell 110 may be around the opening portion 121h. For example, the first holder 121 may include a sidewall surrounding the lower end 110d of the battery cell 110 to define the correct position of the battery cell 110, at least a portion of the bottom of the first holder 121 surrounding the sidewall may be opened to form the 121h, and heat transmission to the cooler 160 may be efficiently performed through the opening 121h of the first holder 121.

The cooler 160 may have a suitable shape capable of performing the heat dissipation of the battery cell 110, and the cooler 160 may have the shape of a solid plate formed of an excellent thermally-conductive material or may have the shape of a block having a flow path formed therein to form a path of a cooling medium. For example, the cooler 160 may be formed of an anodized aluminum plate.

The plurality of battery cells 110 of the battery pack may be structurally bound by the cell holder 120 and may be electrically connected to each other by the rigid PCB 130. For example, the plurality of battery cells 110 bound by the cell holder 120 and the rigid PCB 130 may be insulated from the external environment by being accommodated in a housing including an upper cover 150, a lower cover 170, and a side plate 180 between the upper cover 150 and the lower cover 170.

As illustrated in FIG. 1, the rigid PCB 130 may include a bus BUS (to electrically connect different battery cells 110) and a battery management system (BMS) (to control a charge/discharge operation of the battery cells 110).

The bus BUS and the BMS may be in different regions on the plane of the rigid PCB 130. For example, the rigid PCB 130 may have a substantially rectangular shape having a pair of long sides and a pair of short sides. The bus BUS and the BMS may be on one side and another side of the rigid PCB 130 in a long side direction (e.g., lengthwise or first direction X1) thereof. For example, the BMS may be arranged on or adjacent to one end (e.g., one short side) in the long side direction of the rigid PCB 130 (e.g., the first direction X1). In an implementation, a first output terminal P1 and a second output terminal P2 (having different polarities) may be in the BMS, and the first and second output terminals P1 and P2 may extend outwardly in the first direction X1 from one short side of the rigid PCB 130.

Figure 4:
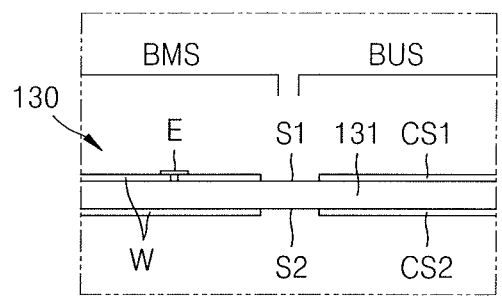
FIG. 4 illustrates a cross-sectional view of a rigid printed circuit board (PCB) of FIG. 1.

FIG. 4 illustrates a cross-sectional view of a rigid PCB of FIG. 1.

Referring to the drawings, the rigid PCB 130 may include the bus BUS to electrically connect different battery cells 110 and the BMS to control a charge/discharge operation of the battery cells 110. The bus BUS and the BMS may be a portion of one rigid PCB 130 that is integrally formed, and the bus BUS and the BMS may have common base layers that are continuously connected to each other. In an implementation, the bus BUS and the BMS may include an insulating substrate 131 as a common base layer.

The bus BUS and the BMS may be on a same plane of the rigid PCB 130. In an implementation, the bus BUS and the BMS may be in different regions on the plane of the rigid PCB 130 or may be formed together on the same plane of the rigid PCB 130 instead of being formed at vertically separate positions in a thickness direction of the rigid PCB 130. For example, the bus BUS and the BMS may have a common base layer that is continuously connected, and the common base layer may be an insulating substrate 131 formed of an electrically-insulating material. The insulating substrate 131 may provide the rigidity of the rigid PCB 130, and the rigid PCB 130 including the insulating substrate 131 may have a relatively high rigidity. For example, unlike a flexible PCB, fluttering may be prevented and workability may be improved in a connection operation with the battery cell 110.

The bus BUS may be on both surfaces of the rigid PCB 130. For example, the bus BUS may include a first conductive region CS1 (on a first surface S1 of the insulating substrate 131) and a second conductive region CS2 on a second surface S2 of the insulating substrate 131. The BMS may be on both the first and second surfaces S and S2 of the rigid PCB 130, e.g., the BMS may include a conductive pattern W (on the first and second surfaces S1 and S2 of the insulating substrate 131) and a plurality of circuit elements E (electrically connected to the conductive pattern W).

The first and second surfaces S and S2 of the insulating substrate 131, which are opposite to each other, may correspond to the first and second surfaces S1 and S2 of the rigid PCB 130, which are opposite to each other, and may correspond to the first and second surfaces S and S2 opposite to each other in the bus BUS and the BMS, respectively.

The bus BUS and the BMS may be a portion of the rigid PCB 130, and the rigid PCB 130 may hereinafter be construed as meaning the bus BUS or the BMS. For example, the rigid PCB 130 connected to the electrodes 111 and 112 of the battery cells 110 may be construed as meaning the bus BUS in the rigid PCB 130.

Figure 5:
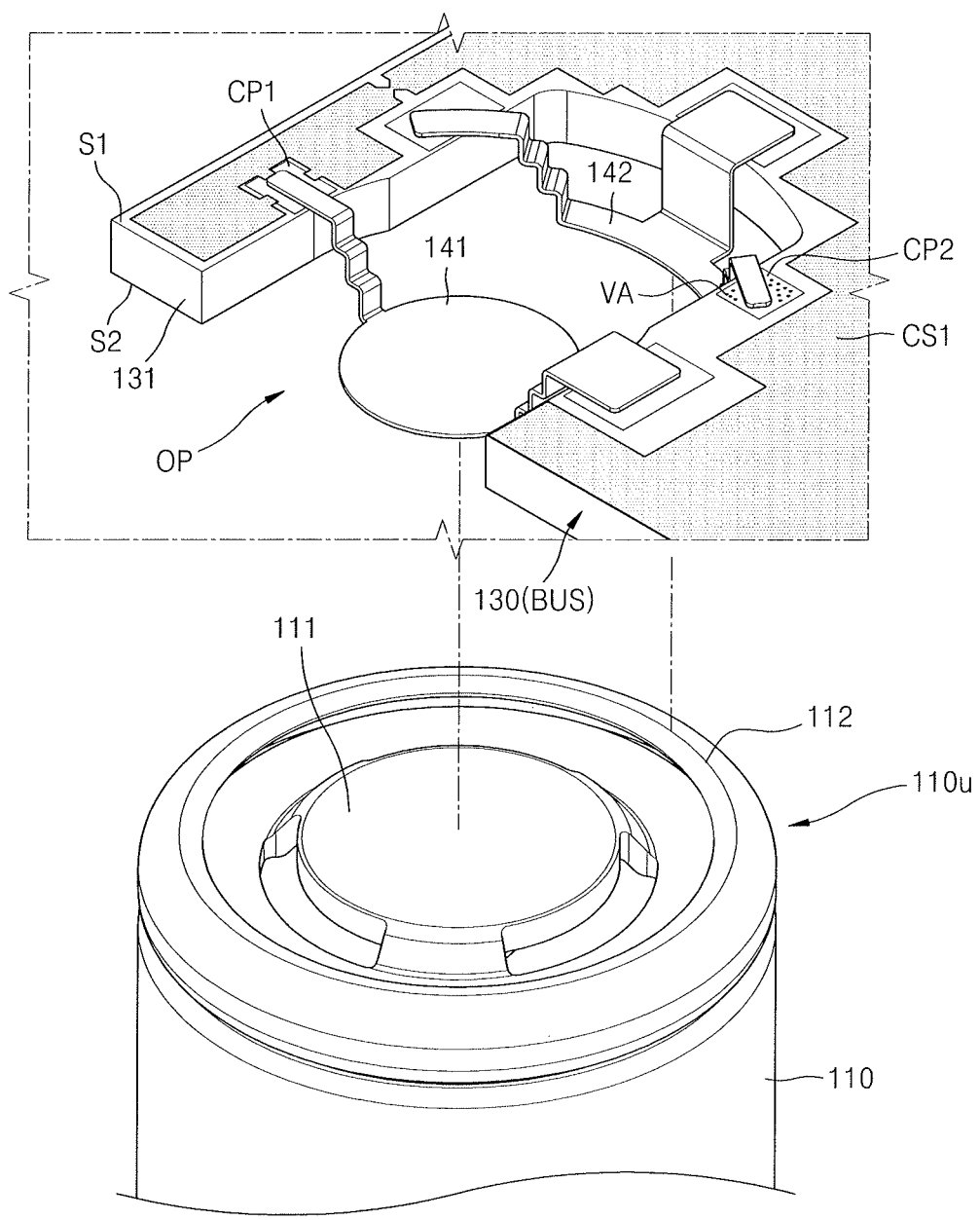
FIG. 5 illustrates a schematic diagram of a connection between a bus and a battery cell of FIG. 1.
Figure 6:
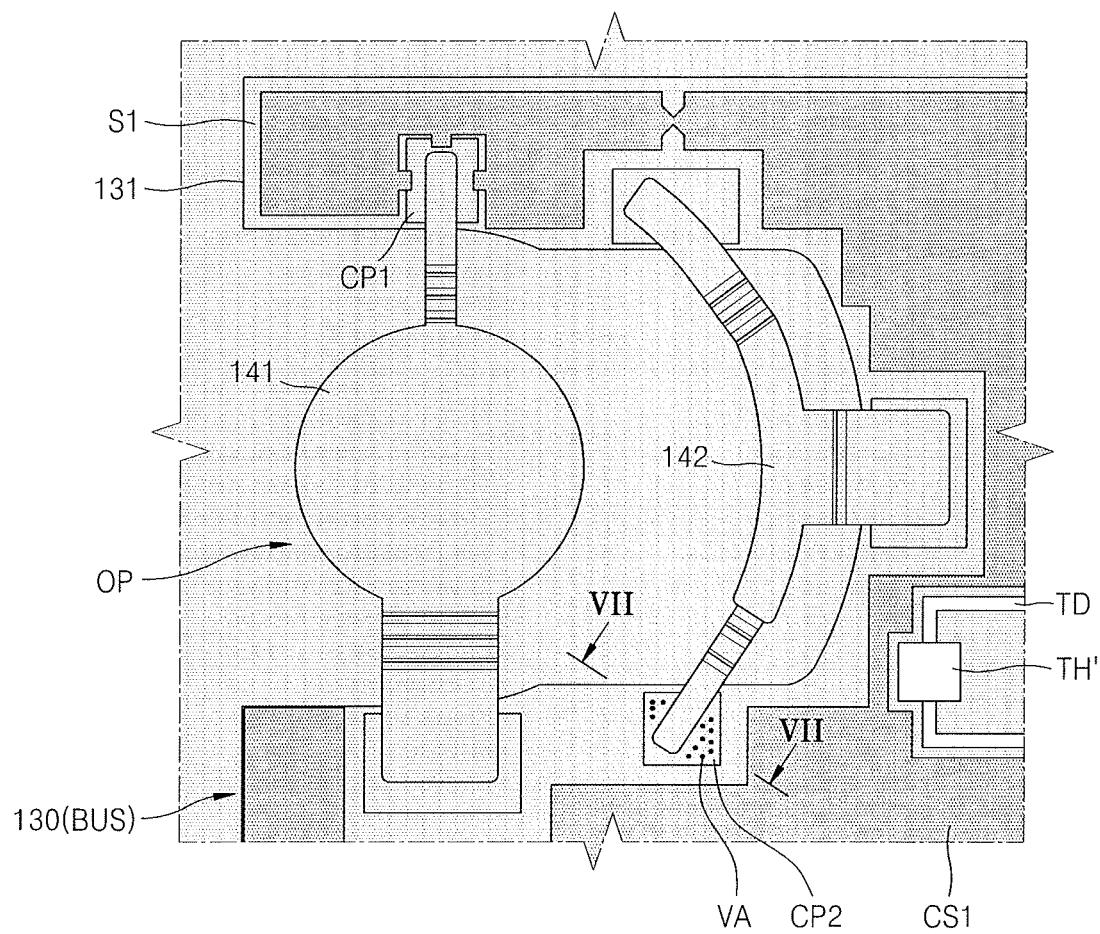
FIG. 6 illustrates a plan view of a first surface side of a rigid PCB illustrated in FIG. 5.
Figure 7:
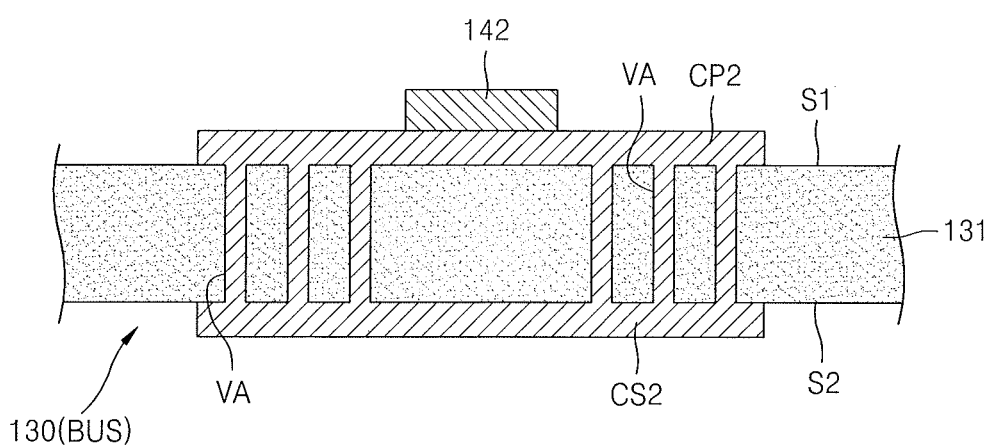
FIG. 7 illustrates a cross-sectional view taken along a line VII-VII of FIG. 6.
Figure 8:
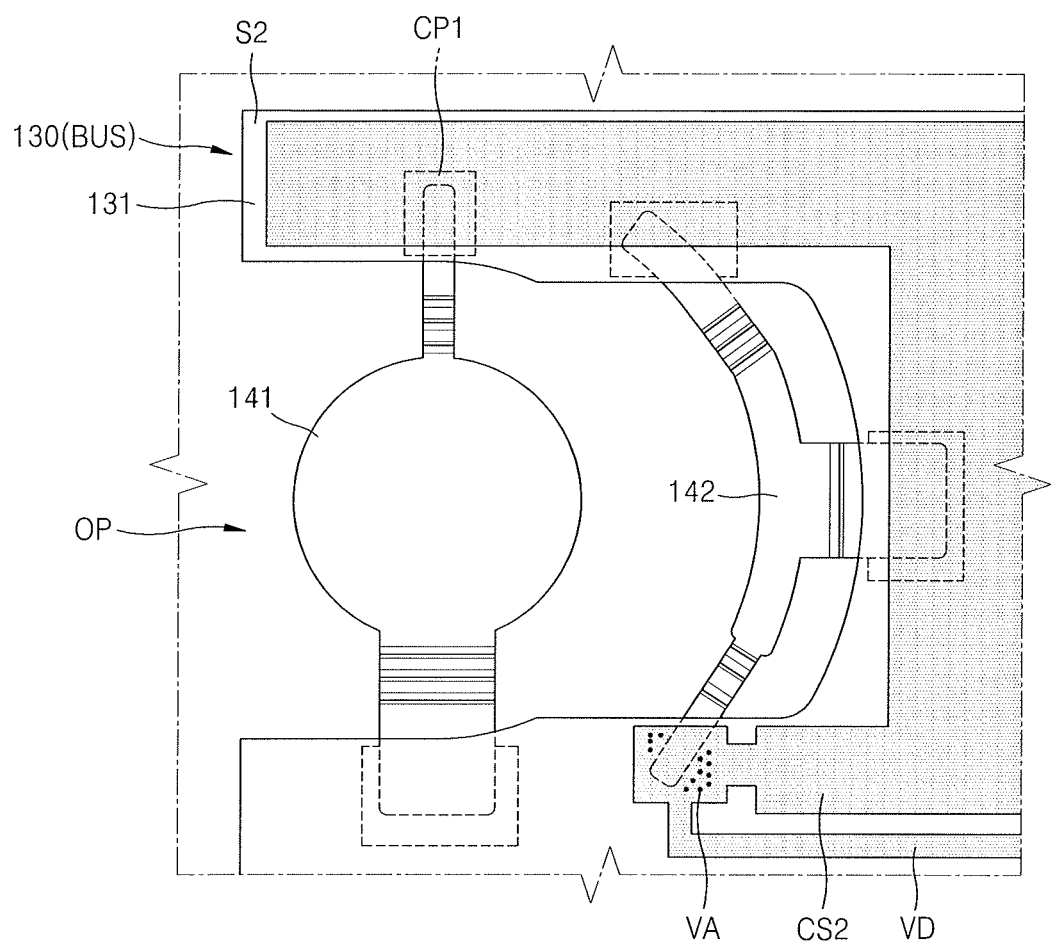
FIG. 8 illustrates a plan view of a second surface side of the rigid PCB of FIG. 5.

FIG. 5 illustrates a diagram of connection between the and a battery cell of FIG. 1. FIG. 6 illustrates a plan view of a first surface side of a rigid PCB of FIG. 5. FIG. 7 illustrates a cross-sectional view taken along a line VII-VII of FIG. 6. FIG. 8 illustrates a plan view of a second surface side of the rigid PCB of FIG. 5.

Referring to FIGS. 6 and 8, the bus BUS may include the first conductive region CS1 and the second conductive region CS2 respectively on the first and second surfaces S1 and S2 of the insulating substrate 131. In an implementation, the first and second conductive regions CS1 and CS2 may have different polarities, and the first conductive region CS1 may be electrically connected to the first electrode 111 (see FIG. 5) of the battery cell 110 to have the same polarity as the first electrode 111 of the battery cell 110 and may be connected to the first electrodes 111 of the battery cells 110 to connect the first electrodes 111 of the battery cells 110 in parallel to each other. The second conductive region CS2 may be electrically connected to the second electrode 112 (see FIG. 5) of the battery cell 110 to have the same polarity as the second electrode 112 of the battery cell 110 and may be connected to the second electrodes 112 of the battery cells 110 to connect the second electrodes 112 of the battery cells 110 in parallel to each other.

The first and second electrodes 111 and 112 of the battery cell 110 may be connected to elements on the first surface S1 of the bus BUS through an opening OP in the bus BUS. For example, the first electrode 111 may be connected to the first conductive region CS1 on the first surface S1, and the second electrode 112 may be connected from the first surface S1 to the second surface S2 of the bus BUS through a via hole VA (see FIG. 7) to be connected to the second conductive region CS2 on the second surface S2.

As illustrated in FIG. 5, the first electrode 111 of the battery cell 110 may be connected to the first conductive region CS1 via a first conductive pad CP1 on the first surface S1 of the bus BUS. In an implementation, as illustrated in FIGS. 5 to 8, the second electrode 112 of the battery cell 110 may be connected to the second conductive region CS2 on the second surface S2 of the bus BUS, via a second conductive pad CP2 on the first surface S1 of the bus BUS and through a via hole VA connecting the first and second surfaces S1 and S2 of the bus BUS.

In an implementation, a first electrode tab 141 and a second electrode tab 142 may be located between the bus BUS (the rigid PCB 130) and the first and second electrodes 111 and 112 of the battery cell 110. For example, the first and second electrodes 111 and 112 of the battery cell 110 and the first and second conductive regions CS1 and CS2 of the bus BUS may be connected to each other via the first and second electrode tabs 141 and 142. In this case, the first and second electrode tabs 141 and 142 may be connected to the first and second electrodes 111 and 112 of the battery cell 110 through the opening OP of the bus BUS and may be welded or soldered onto the first and second conductive pads CP1 and CP2 on the first surface S1 of the bus BUS in a state of being suspended around the opening OP. For example, the first electrode tab 141 may be connected to the first conductive region CS1 of the first surface S1 through the first conductive pad CP1 on the first surface S1 of the bus BUS. The second electrode tab 142 may be connected to the second conductive region CS2 (see FIG. 8) of the second surface S2 via the second conductive pad CP2 on the first surface S1 of the bus BUS and the via hole VA passing through the first and second surfaces S1 and S2 of the bus BUS.

The first and second electrode tabs 141 and 142 may be formed of plate-shaped metal pieces and may form a more stable conductive coupling due to their excellent structural rigidity (unlike wire-type metal thin lines), and the risk of an accident such as ignition may be low in comparison with the metal thin lines. In an implementation, the first and second electrode tabs 141 and 142 may be omitted, and as described below with reference to FIG. 11, the first and second electrodes 111 and 112 of the battery cell 110 may be directly connected to the bus BUS (or the rigid PCB 130) without separate first and second electrode tabs 141 and 142 therebetween.

Figure 9:
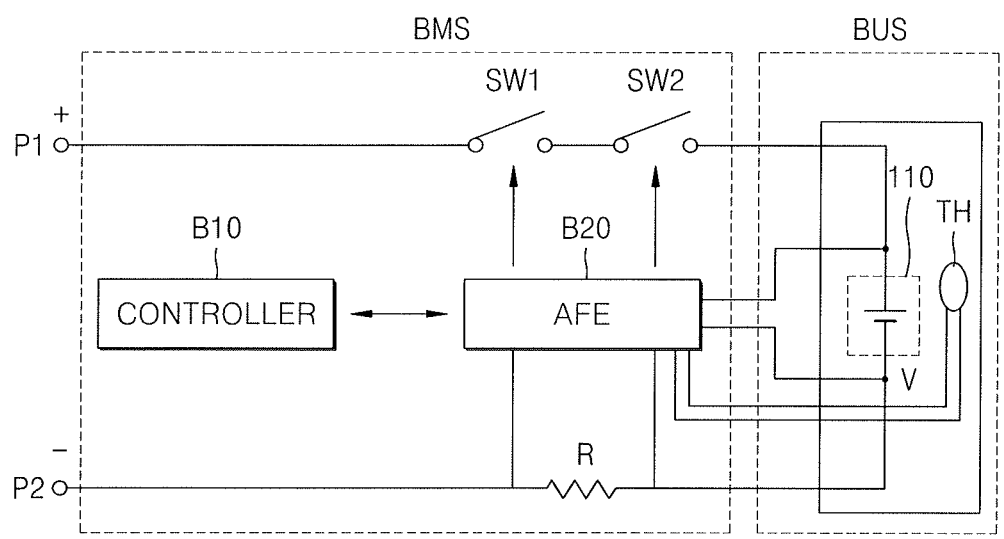
FIG. 9 illustrates a diagram of a schematic configuration of a battery management system (BMS)

FIG. 9 illustrates a diagram of a schematic configuration of a BMS.

Referring to the drawings, the BMS may monitor the state of the battery cell 110 and control the charge/discharge operation of the battery cell 110. For example, the BMS may obtain information about temperature and voltage through a voltage measurement terminal V and a thermistor TH mounted in the bus BUS. In an implementation, as illustrated in FIG. 6, a sensor hole TH' (into which the thermistor TH may be inserted) may be in the bus BUS, and the temperature of the battery cell 110 may be measured through the thermistor TH inserted into the sensor hole TH'. For example, a temperature measurement pattern TD electrically connected to the thermistor TH to apply power to both ends of the thermistor TH may be formed around the sensor hole TH', and the temperature measurement pattern TD electrically connected to the thermistor TH may be connected from the bus BUS to the BMS across any one of the first and second surfaces S1 and S2 of the rigid PCB 130. The temperature measurement pattern TD may be formed on any one of the first and second surfaces S1 and S2 of the rigid PCB 130 and, e.g., may be formed on the same level as the first conductive region CS1 from among the first and second conductive regions CS1 and the CS2. For example, an insulating gap may be formed between the temperature measurement pattern TD and the first conductive region CS1 formed on the same first surface S as the temperature measurement pattern TD.

The voltage measurement terminal V (see FIG. 9) may be connected to the electrodes 111 and 112 of the battery cell 110. In an implementation, as illustrated in FIG. 8, the first and second electrode tabs 141 and 142 connected to the first and second electrodes 111 and 112 of the battery cell 110 may function as the voltage measurement terminal V, and a portion of the first and second conductive regions CS1 and CS2 electrically connected to the first and second electrode tabs 141 and 142 may be branched from the charge/discharge path to form a voltage measurement pattern VD.

In an implementation, as illustrated in FIG. 8, the second electrode tab 142 may function as the voltage measurement terminal V, and a portion of the second conductive region CS2 connected to the second electrode tab 142 may be branched to form the voltage measurement pattern VD. For example, the voltage measurement pattern VD may be formed together with the second conductive region CS2 on the second surface S2 of the rigid PCB 130 and may be connected from the bus BUS to the BMS across the second surface S2 of the rigid PCB 130. In an implementation, the first electrode tab 141 may function as the voltage measurement terminal V, and a portion of the first conductive region CS1 connected to the first electrode tab 141 may be branched to form the voltage measurement pattern VD. For example, the voltage measurement pattern VD may be formed together with the first conductive region CS1 on the first surface S1 of the rigid PCB 130.

Referring to FIG. 9, a charge/discharge path connected to the first and second output terminals P1 and P2 may be formed in the BMS, and a current sensor R may be arranged on the charge/discharge path. The BMS may measure a charge/discharge current amount by using the current sensor R arranged on the charge/discharge path.

The BMS may obtain information about temperature and voltage through the voltage measurement terminal V and the thermistor TH mounted in the bus BUS, measure the charge/discharge current amount by using the current sensor R arranged on the charge/discharge path, catch an abnormal situation (e.g., overcharge, overdischarge, or overcurrent) based on state information such as voltage, current, and temperature, and control the charge/discharge operation of the battery cell 110. For example, a charge switch SW2 and a discharge switch SW1 connected on the charge/discharge path may be formed in the BMS, and the charge/discharge operation of the battery cell 110 may be controlled by controlling the on/off operation of the charge switch SW2 and the discharge switch SW1.

The BMS may perform a cell balancing operation for balancing the charge state between the respective battery cells 110; for example, the BMS may perform a cell balancing operation of discharging the battery cell 110 having a relatively high charge state and/or charging the battery cell 110 having a relatively low charge state.

A controller B10 to control an overall operation of the BMS may be formed in the BMS, and the BMS may include an analog front end (AFE) B20 for converting a measurement value such as a temperature or a voltage transmitted from the bus BUS into a quantized digital value and transmitting the same to the controller B10 and outputting an on/off signal for the charge switch SW2 and the discharge switch SW1 according to a control signal of the controller B10.

Figure 10:
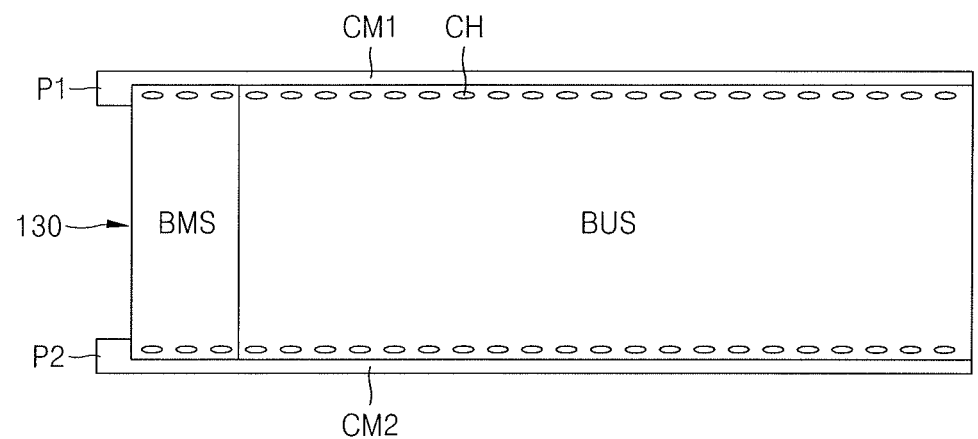
FIG. 10 illustrates a diagram of a modification of a rigid PCB of FIG. 1.

FIG. 10 illustrates a modification of the rigid PCB 130 of FIG. 1.

Referring to the drawings, in the rigid PCB 130, a first edge connector CM1 and a second edge connector CM2 may be connected to the pair of long sides of the rigid PCB 130, and a plurality of coupling holes CH for connection of the first and second edge connectors CM1 and CM2 may be formed along the pair of long sides. The first and second edge connectors CM1 and CM2 and the rigid PCB 130 may be soldered to each other through the coupling holes CH. The coupling holes CH may be arranged in rows along the long sides of the rigid PCB 130, and the electrical resistance between the rigid PCB 130 and the first and second edge connectors CM1 and CM2 may be reduced because a plurality of coupling holes CH are formed in rows. The first and second edge connectors CM1 and CM2 may extend across the bus BUS and the BMS to communicate the charge/discharge current of the battery cell 110 and provide a charge/discharge current path. The long side direction of the rigid PCB 130 (e.g., the first direction X1 of FIG. 1) may correspond to the input/output direction of the charge/discharge current.

The first and second output terminals P1 and P2 having different polarities in the BMS may extend along a same direction (e.g., first direction X of FIG. 1) as the long sides of the rigid PCB 130. For example, the first and second output terminals P and P2 may be the ends of the first and second edge connectors CM1 and CM2 extending from the bus BUS across the BMS.

Figure 11:
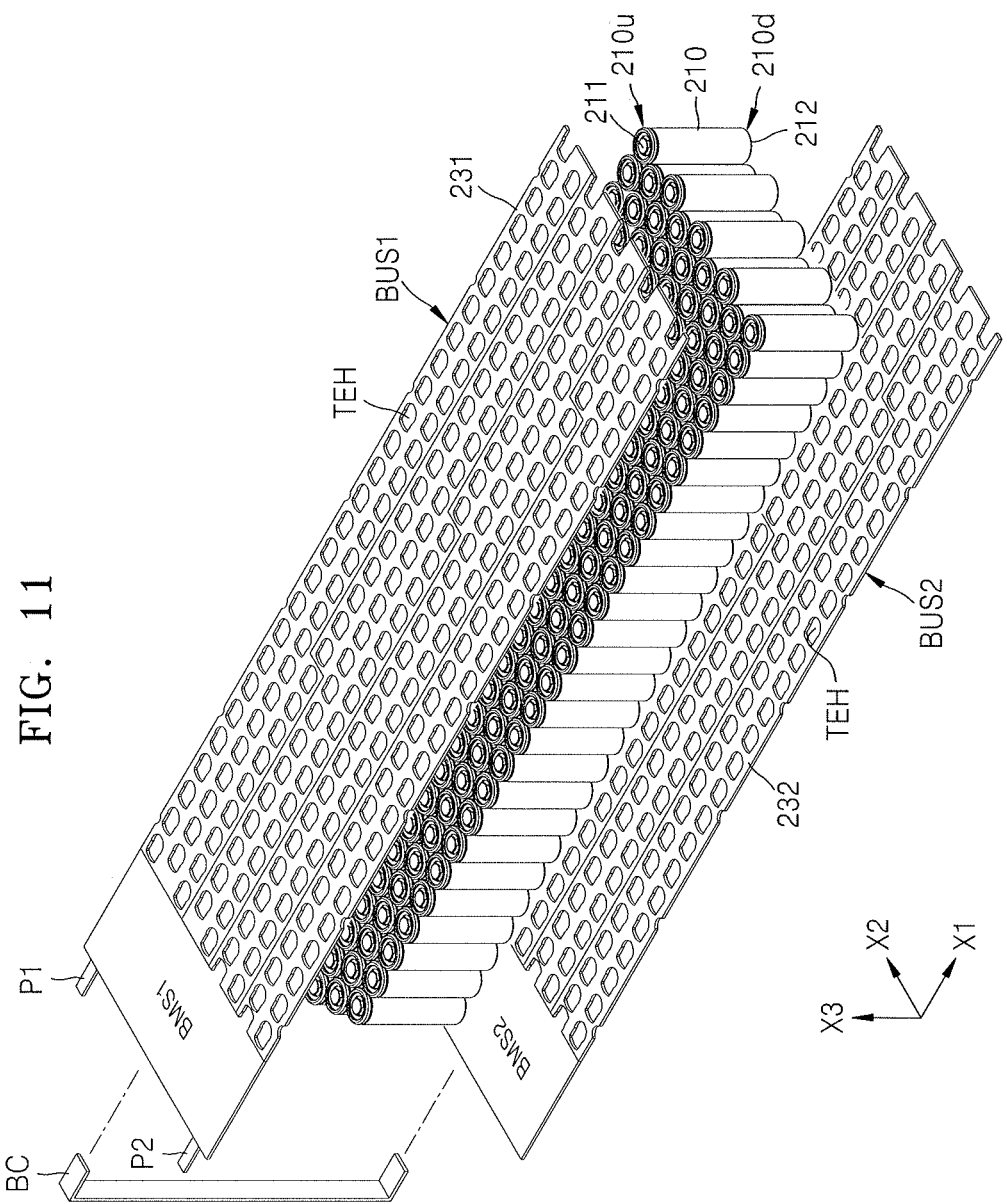
FIG. 11 illustrates a perspective view of a battery pack according to another embodiment of the present disclosure.
Figure 12:
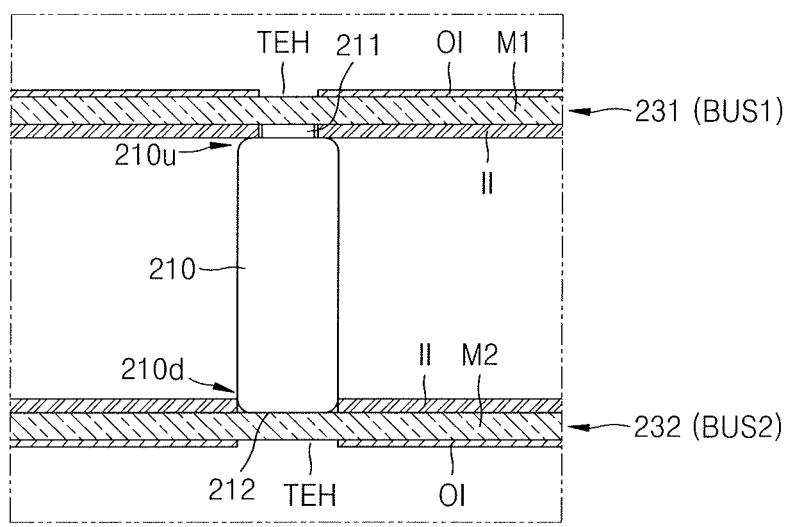
FIG. 12 illustrates a diagram of the connection between a battery cell and a rigid PCB of FIG. 11.
Figure 13A:
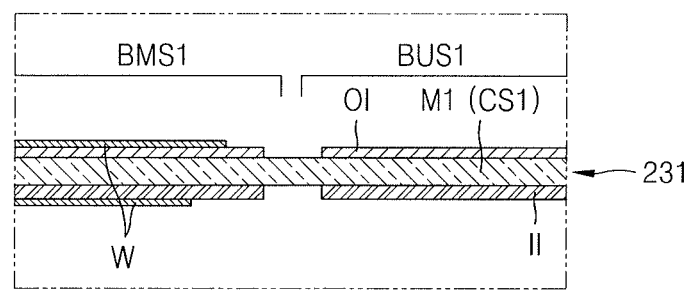
FIGS. 13A and 13B illustrate cross-sectional views of a structure of the rigid PCB of FIG. 11.
Figure 13B:
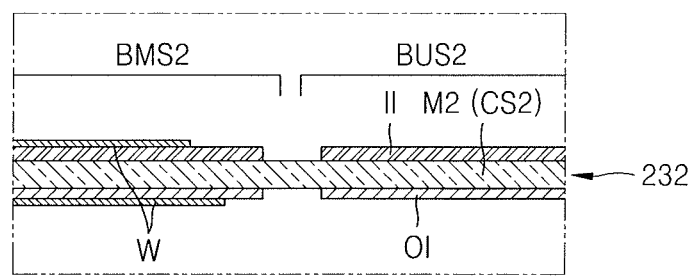

FIG. 11 illustrates a perspective view of a battery pack according to another embodiment of the present disclosure. FIG. 12 illustrates a diagram of the connection between a battery cell and a rigid PCB of FIG. 11. FIGS. 13A and 13B illustrate cross-sectional views of a structure of the rigid PCB of FIG. 11. FIG. 14 illustrates a perspective view of a portion of the rigid PCB of FIG. 11.

Referring to FIG. 11, rigid PCBs 231 and 232 may include a first rigid PCB 231 (electrically connected to a first electrode 211 of a battery cell 210 while extending across an upper end 210u of the battery cell 210) and a second rigid PCB 232 (electrically connected to a second electrode 212 of the battery cell 210 while extending across a lower end 210d of the battery cell 210).

Similarly to the embodiment of FIG. 1, the rigid PCBs 231 and 232 of the present embodiment may also include buses (a first bus BUS1 and a second bus BUS2) to electrically connect different battery cells 210 and BMSs a first BMS BMS1 and a second BMS2) to control the charge/discharge operation of the battery cells 210.

The first and second buses BUS1 and BUS2 may be formed in a distributed manner in the first and second rigid PCBs 231 and 232. For example, the first and second buses BUS1 and BUS2 may include the first bus BUS1 in the first rigid PCB 231 and the second bus BUS2 in the second rigid PCB 232. Similarly, the first and second BMSs BMS1 and BMS2 may also be formed in a distributed manner in the first and second rigid PCBs 231 and 232. For example, the first and second BMSs BMS1 and BMS2 may include the first BMS BMS1 in the first rigid PCB 231 and a second BMS BMS2 in the second rigid PCB 232.

The first rigid PCB 231 may include the first bus BUS1 and the first BMS BMS1. For example, the first bus BUS1 and the first BMS BMS1 may be in different regions on the plane of the first rigid PCB 231. For example, the first rigid PCB 231 may have a substantially rectangular shape having a pair of long sides and a pair of short sides. The first bus BUS1 may be adjacent to one short side and the first BMS BMS1 may be adjacent to the other short side of the first rigid PCB 231 (e.g., at opposite sides of the first rigid PCB 231 relative to the first direction X1). For example, the first BMS BMS1 may be at one side of the first rigid PCB 231 in a long side direction (the first direction X1).

The second rigid PCB 232 may include the second bus BUS2 and the second BMS BMS2. For example, the second bus BUS2 and the second BMS BMS2 may be in different regions on the plane of the second rigid PCB 232. For example, the second bus BUS2 may be adjacent to one short side and the second BMS BMS2 may be adjacent to the other short side of the of the second rigid PCB 232 (e.g., at opposite sides of the second rigid PCB 232 relative to the first direction X1). For example, the second BMS BMS2 may be at one side of the second rigid PCB 232 in a long side direction (the first direction X1).

The first and second buses BUS1 and BUS2 and the first and second BMSs BMS1 and BMS2 may be a portion of the first rigid PCB 231 or the second rigid PCB 232 respectively, and hereinafter, the first and second rigid PCBs 231 and 232 may refer to the first and second buses BUS1 and BUS2 or the first and second BMSs BMS1 and BMS2. For example, the first and second rigid PCBs 231 and 232 to which the electrodes 211 and 212 of the battery cell 210 are connected may refer to the first and second buses BUS1 and BUS2 in the first and second rigid PCBs 231 and 232.

Hereinafter, the buses BUS1 and BUS2 may refer to any one (BUS1 or BUS2) of the first and second buses BUS1 and BUS2 or both (BUS1 and BUS2) of the first and second buses BUS1 and BUS2, and the BMSs BMS1 and BMS2 may refer to any one (BMS1 or BMS2) of the first and second BMSs BMS1 and BMS2 or both (BMS1 and BMS2) of the first and second BMSs BMS1 and BMS2. Also, hereinafter, the rigid PCBs 231 and 232 may refer to any one (231 or 232) of the first and second rigid PCBs 231 and 232 or both (231 and 232) of the first and second rigid PCBs 231 and 232.

In an implementation, as illustrated in FIG. 12, the first and second electrodes 211, 212 of the battery cell 210 may be directly connected to the first and second rigid PCBs 231 and 232 (the first and second buses BUS1 and BUS2), and the first and second electrode tabs 141 and 142 (FIG. 5) mediating the electrical connection between the first and second electrodes 111 and 112 and the rigid PCB 130 (the bus BUS) may not be provided therebetween as in an embodiment illustrated in FIG. 5. For example, the first and second electrodes 211 and 212 of the battery cell 210 are directly connected to the first and second rigid PCBs 231 and 232 (the first and second buses BUS1 and BUS2) without passing through the electrode tabs 141 and 142 (FIG. 5), and the resistance of the charge/discharge path may be reduced and thus the output thereof may be improved and the assembly process of the battery pack may be simplified.

In the battery pack illustrated in FIG. 5, the first and second electrodes 111 and 112 of the battery cell 110 and the first and second electrode tabs 141 and 142 coupled to the rigid PCB 130 may be respectively coupled together after the rigid PCB 130 and the battery cell 110 are aligned such that the first and second electrode tabs 141 and 142 of the rigid PCB 130 and the first and second electrodes 111 and 112 of the battery cell 110 are position-aligned in a state where the first and second electrode tabs 141 and 142 are coupled around the opening portion OP of the rigid PCB 130 (the bus BUS). In the present embodiment, the first and second electrodes 211 and 212 of the battery cell 210 may be directly coupled to the first and second rigid PCBs 231 and 232 (the first and second buses BUS1 and BUS2), and the coupling process between the battery cell 210 and the rigid PCBs 231 and 232 may be simplified.

In an implementation, as illustrated in FIGS. 13A and 13B, the buses BUS1 and BUS2 and the BMSs BMS1 and BMS2 may have common base layers continuously connected to each other, and the common base layers may be provided as metal substrates M1 and M2. The metal substrates M1 and M2 may provide the rigidity of the rigid PCBs 231 and 232, and as for the rigid PCBs 231 and 232 including the metal substrates M1 and M2 having a relatively high rigidity, unlike a flexible PCB, fluttering may be prevented and thus workability may be improved in a connection operation with the battery cell 210. The metal substrates M1 and M2 may be continuously formed over the buses BUS1 and BUS2 and the BMSs BMS1 and BMS2 and may form common base layers in the buses BUS1 and BUS2 and the BMSs BMS1 and BMS2. For example, the first/second buses BUS1/BUS2 may include the first/second metal substrate M1/M2 and an inner insulating layer II and an outer insulating layer OI that are on both surfaces of the first/second metal substrate M1/M2.

The BMSs BMS1 and BMS2 may include the first BMS BMS1 in the first rigid PCB 231 and the second BMS BMS2 in the second rigid PCB 232. For example, the first BMS BMS1 may include a conductive pattern W formed on at least one of both surfaces of the first metal substrate M1 and a plurality of circuit elements electrically connected to the conductive pattern W. For example, the inner insulating layer II or the outer insulating layer OI may be between the first metal substrate M1 and the conductive pattern W and a circuit element. For example, the second BMS BMS2 may include a conductive pattern W on at least one of both surfaces of the second metal substrate M2 and a plurality of circuit elements electrically connected to the conductive pattern W, and the inner insulating layer II or the outer insulating layer OI may be between the second metal substrate M2 and the conductive pattern W and a circuit element.

Referring to FIG. 14, the first and second metal substrates M1 and M2 may be unpatterned metal plates, may be formed of metal plates having uniform widths d1 and d2 (e.g., in the second direction X2), and may not have a conductive pattern for intentionally setting the direction of the charge/discharge path or a pattern protruding toward the first and second electrodes 211 and 212 of the battery cell 210.

The first and second metal substrates M1 and M2 may provide the conductive regions CS1 and CS2 connected to the electrodes 211 and 212 of the battery cell 210. For example, a plurality of battery cells 210 may form a common first electrode 211 by the first metal substrate M1 and may be connected in parallel to each other, and the first metal substrate M1 may form the first conductive region CS1 connecting the first electrodes 211 of the plurality of battery cells 210 in parallel to each other. Similarly, the plurality of battery cells 210 may form a common second electrode 212 by the second metal substrate M2 and may be connected in parallel to each other, and the second metal substrate M2 may form the second conductive region CS2 connecting the second electrodes 212 of the plurality of battery cells 210 in parallel to each other.

Referring to FIG. 12, an inner insulating layer II and an outer insulating layer OI may be formed on both surfaces of the first and second metal substrates M1 and M2, respectively. The inner insulating layer II may be formed at an inner position closer to the battery cell 210 with respect to the first and second metal substrates M1 and M2, and the outer insulating layer OI may be formed at an outer position farther from the battery cell 210 with respect to the first and second metal substrates M1 and M2. In an implementation, the inner insulating layer II and the outer insulating layer OI of the rigid PCBs 231 and 232 may include an electrode hole TEH formed at a position corresponding to the electrodes 211 and 212 of the battery cell 210.

The electrode hole TEH in the inner insulating layer II may be at a position corresponding to the electrodes 211 and 212 of the battery cell 210 so as not to obstruct the electrical connection between the first and second metal substrates M1 and M2 and the electrodes 211 and 212 of the battery cell 210. The electrode hole TEH in the outer insulating layer OI may be at a position corresponding to the electrodes 211 and 212 of the battery cell 210 so as to allow the soldering or welding between the first and second metal substrates M1 and M2 and the electrodes 211 and 212 of the battery cell 210 and facilitate the approach of a coupling tool. For example, the electrode hole TEH in the inner insulating layer II and the outer insulating layer OI may function as a vent hole for reducing the internal pressure of the battery cell 210 in an abnormal situation where a high pressure is accumulated in the battery cell 210. For example, the electrode hole TEH of the inner insulating layer II and the outer insulating layer OI in the first rigid PCB 231 extending across the upper end 210u of the battery cell 210 in which a vent of the battery cell 210 is formed may function as a vent hole for discharging, to the outside, the high-pressure gas erupted while the vent of the battery cell 210 is broken.

Similarly as described with reference to FIG. 9, based on state information such as temperature and voltage transmitted from the buses BUS1 and BUS2, the BMSs BMS1 and BMS2 may catch an abnormal situation such as overcharge, overdischarge, or overcurrent and control the charge/discharge operation of the battery cell 210. For example, the BMSs BMS1 and BMS2 may include: a controller B10 to control an overall operation of the BMSs BMS1 and BMS2; a charge switch SW2 and a discharge switch SW1 connected on a charge/discharge path to open/close the charge/discharge path; a current sensor R arranged on the charge/discharge path to measure a charge/discharge current amount; and an analog front end (AFE) B20 to convert a measurement value such as a temperature or a voltage transmitted from the buses BUS1 and BUS2 into a quantized digital value and transmitting the same to the controller B10 and to output an on/off signal for the charge switch SW2 and the discharge switch SW1 according to a control signal of the controller B10.

Referring to FIG. 11, the respective components of the BMSs BMS1 and BMS2 may be distributed and arranged in the first and second rigid PCBs 231 and 232, and the first and second BMSs BMS1 and BMS2 in the first and second rigid PCBs 231 and 232 may control the charge/discharge of the battery cell 210 in cooperation with each other. For example, the first and second BMSs BMS1 and BMS2 may be electrically connected to each other, and for this, a BMS connector BC (see FIG. 11) for electrical connection between the first and second BMSs BMS1 and BMS2 may be between the first and second BMSs BMS1 and BMS2. The BMS connector BC may include two or more electrical paths insulated from each other to form a high-current charge/discharge path and a low-current measurement signal path.

The first and second output terminals P1 and P2 having different polarities may be formed in the BMSs BMS1/BMS2, and the first and second output terminals P and P2 may extend along or from a pair of long sides of the rigid PCB 231/232. The first and second output terminals P1 and P2 may be concentrated and formed in any one (BMS1 or BMS2) of the first and second BMSs BMS1 and BMS2, e.g., in the first BMS BMS1.

According to the present disclosure, a bus to electrically connect a plurality of battery cells to each other and a BMS to control a charge/discharge operation of the battery cell may be provided as one rigid PCB, and a plurality of components may be modularized into one assembly, and an assembly process of a battery pack may be improved.

According to an embodiment of the present disclosure, an electrode of the battery cell may be directly connected to the rigid PCB without interposing an electrode tab for mediating the electrical connection between the battery cell and the rigid PCB, a connection operation of the battery cell may be simplified and the electrical resistance on the charge/discharge path may be reduced, and a battery pack with improved electrical output performance may be provided.

One or more embodiments may provide a battery pack, the assembly process of which may be simplified by modularizing a plurality of components into one assembly.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A battery pack, comprising:
a plurality of battery cells, each battery cell including a first electrode and a second electrode having a different polarity; and
a rigid printed circuit board (PCB) electrically connected to each battery cell and extending across the plurality of battery cells,
wherein the rigid PCB includes:
a bus to electrically connect the plurality of battery cells to each other,
a battery management system (BMS) to control a charge/discharge operation of the plurality of battery cells, and
a first surface and a second surface, the first surface being opposite to the second surface,
wherein the bus includes a first conductive region on the first surface of the rigid PCB and connected to the first electrode of each battery cell and a second conductive region on the second surface of the rigid PCB and connected to the second electrode of each battery cell, and
wherein the second electrode of each battery cell is connected to the second conductive region on the second surface of the rigid PCB, via a second conductive pad on the first surface of the rigid PCB and through a via hole connecting the first and second surfaces of the rigid PCB.

2. The battery pack of claim 1, wherein:
the rigid PCB has a rectangular shape including a pair of long sides and a pair of short sides, and
the bus is adjacent to one short side and the BMS is adjacent to the other short side.

3. The battery pack of claim 2, wherein the rigid PCB includes a plurality of coupling holes along the pair of long sides thereof, the coupling holes being to connect a first edge connector and a second edge connector along the pair of long sides of the rigid PCB.

4. The battery pack of claim 1, wherein the bus and the BMS have a common, continuous base layer.

5. The battery pack of claim 4, wherein the common base layer includes an insulating substrate.

6. The battery pack of claim 1, wherein:
the first and second electrodes of each battery cell are at a same one end of the battery cell in a lengthwise direction of the battery cell, and
the rigid PCB extends across the one end of the battery cells.

7. The battery pack of claim 6, wherein:
the rigid PCB includes a plurality of openings therein, the openings exposing the first and second electrodes of each battery cell,
the first electrode of each battery cell is connected to the rigid PCB through a first electrode tab in the opening, and
the second electrode of each battery cell is connected to the rigid PCB through a second electrode tab in the opening.

8. The battery pack of claim 1, wherein:
the bus includes a measurement pattern to transmit state information of the battery cell to the BMS, and
the measurement pattern is on a first surface of the rigid PCB or a second surface of the rigid PCB.

9. The battery pack of claim 8, wherein:
the measurement pattern is formed together on a surface of the rigid PCB where the first or second conductive region is formed.

10. The battery pack of claim 8, wherein the bus includes a sensor hole into which a thermistor to measure a temperature of the battery cell is insertable.

11. A battery pack in which a plurality of battery cells are accommodatable, the battery pack comprising a rigid printed circuit board (PCB),
wherein:
the rigid PCB is electrically connectable to the plurality of battery cells in a state in which the rigid PCB extends across the plurality of battery cells, and
the rigid PCB includes:
a bus to electrically connect the plurality of battery cells to each other,
a battery management system (BMS) to control a charge/discharge operation of the plurality of battery cells, and
a first surface and a second surface, the first surface being opposite to the second surface, each battery cell includes a first electrode and a second electrode having a different polarity, the bus includes a first conductive region on the first surface of the rigid PCB and configured to be connected to the first electrode of each battery cell and a second conductive region on the second surface of the rigid PCB and configured to be connected to the second electrode of each battery cell, and the second electrode of each battery cell is connected to the second conductive region on the second surface of the rigid PCB, via a second conductive pad on the first surface of the rigid PCB and through a via hole connecting the first and second surfaces of the rigid PCB.

\* \* \* \* \*